(12) United States Patent
Annunziata et al.

(10) Patent No.: US 10,644,232 B2
(45) Date of Patent: May 5, 2020

(54) SELF-ALIGNED AND MISALIGNMENT-TOLERANT LANDING PAD FOR MAGNETORESISTIVE RANDOM ACCESS MEMORY

(71) Applicant: International Business Machines Corporation, Armonk, NY (US)

(72) Inventors: Anthony J. Annunziata, Stamford, CT (US); Chandrasekharan Kothandaraman, New York, NY (US); Nathan P. Marchack, White Plains, NY (US); Eugene J. O'Sullivan, Nyack, NY (US)

(73) Assignee: International Business Machines Corporation, Armonk, NY (US)

( * ) Notice: Subject to any disclaimer, the term of this patent is extended or adjusted under 35 U.S.C. 154(b) by 27 days.

(21) Appl. No.: 15/856,681

(22) Filed: Dec. 28, 2017

(65) Prior Publication Data

US 2019/0207099 A1    Jul. 4, 2019

(51) Int. Cl.
*H01L 43/12* (2006.01)
*H01L 43/08* (2006.01)
*H01L 27/22* (2006.01)
*H01L 43/02* (2006.01)

(52) U.S. Cl.
CPC ............ *H01L 43/12* (2013.01); *H01L 27/222* (2013.01); *H01L 43/02* (2013.01); *H01L 43/08* (2013.01)

(58) Field of Classification Search
CPC .......... H01L 43/12; H01L 43/08; H01L 43/02
See application file for complete search history.

(56) References Cited

U.S. PATENT DOCUMENTS

| | | | |
|---|---|---|---|
| 6,664,163 B2 | 12/2003 | Fujishima et al. | |
| 7,884,433 B2 | 2/2011 | Zhong et al. | |
| 8,084,760 B2 | 12/2011 | Lung et al. | |
| 8,183,061 B2 | 5/2012 | Zhong et al. | |
| 8,324,698 B2 | 12/2012 | Zhong et al. | |
| 9,087,983 B2 | 7/2015 | Guo | |
| 9,166,154 B2 | 10/2015 | Satoh et al. | |
| 9,373,663 B2 | 6/2016 | Satoh et al. | |
| 2010/0109106 A1 | 5/2010 | Zhong et al. | |
| 2013/0341801 A1* | 12/2013 | Satoh .................. | H01L 43/02 257/774 |

(Continued)

FOREIGN PATENT DOCUMENTS

| | | |
|---|---|---|
| JP | 4716867 | 7/2011 |
| RU | 2532589 | 11/2014 |

*Primary Examiner* — Douglas M Menz
(74) *Attorney, Agent, or Firm* — Fleit Intellectual Property Law; Thomas S. Grzesik

(57) ABSTRACT

A semiconductor device and a method for fabricating the same. The semiconductor device includes a substrate and at least one trench line formed within the substrate. The semiconductor device further includes a self-aligned landing pad in contact with the at least one trench line, and a magnetic tunnel junction stack formed on and in contact with the self-aligned landing pad. The method includes forming a conductive layer on and in contact with at least one trench line formed within a substrate. Magnetic tunnel junction stack layers are deposited on and in contact with the conductive layer. The magnetic tunnel junction stack layers are etched to form a magnetic tunnel junction stack, where the etching stops on the conductive layer.

9 Claims, 6 Drawing Sheets

(56) References Cited

U.S. PATENT DOCUMENTS

| | | | |
|---|---|---|---|
| 2015/0021724 A1* | 1/2015 | Mani | H01L 43/08 257/421 |
| 2015/0084140 A1 | 3/2015 | Satoh et al. | |
| 2016/0254318 A1* | 9/2016 | Lu | G11C 11/161 257/421 |
| 2019/0237659 A1* | 8/2019 | Annunziata | H01L 27/222 |

* cited by examiner

SELF-ALIGNED AND MISALIGNMENT-TOLERANT LANDING PAD FOR MAGNETORESISTIVE RANDOM ACCESS MEMORY

BACKGROUND OF THE INVENTION

The present disclosure generally relates to semiconductor devices, and more particularly relates to magnetoresistive random access memory.

Spin-transfer torque magnetoresistive random access memory (STT-MRAM) devices offer many benefits over semiconductor-based memories such as dynamic random-access memory (DRAM) and static random-access memory (SRAM). In order to compete with DRAM and SRAM, the STT-MRAM devices usually need to be integrated into the wiring layers of standard silicon logic and memory chips. However, one difficult aspect of this integration is to align the MRAM device to a landing pad layer in cases where both the MRAM device and landing pad are small and of similar dimensions. In this case, the MRAM device may be damaged by topography from the landing pad due to misalignment of the MRAM lithography and the landing pad lithography.

SUMMARY OF THE INVENTION

In one embodiment, a method for fabricating a semiconductor device is provided. The method comprises forming a conductive layer on and in contact with at least one trench line formed within a substrate. Magnetic tunnel junction stack layers are deposited on and in contact with the conductive layer. The magnetic tunnel junction stack layers are etched to form a magnetic tunnel junction stack, where the etching stops on the conductive layer.

In another embodiment, a semiconductor device is provided. The semiconductor device comprises a substrate and at least one trench line formed within the substrate. The semiconductor device further comprises a self-aligned landing pad in contact with the at least one trench line, and a magnetic tunnel junction stack formed on and in contact with the self-aligned landing pad.

In yet another embodiment, an integrated circuit is provided. The integrated circuit comprises a semiconductor device. The semiconductor device comprises a substrate and at least one trench line formed within the substrate. The semiconductor device further comprises a self-aligned landing pad in contact with the at least one trench line, and a magnetic tunnel junction stack formed on and in contact with the self-aligned landing pad.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present disclosure, in which.

DETAILED DESCRIPTION

Figure 1:
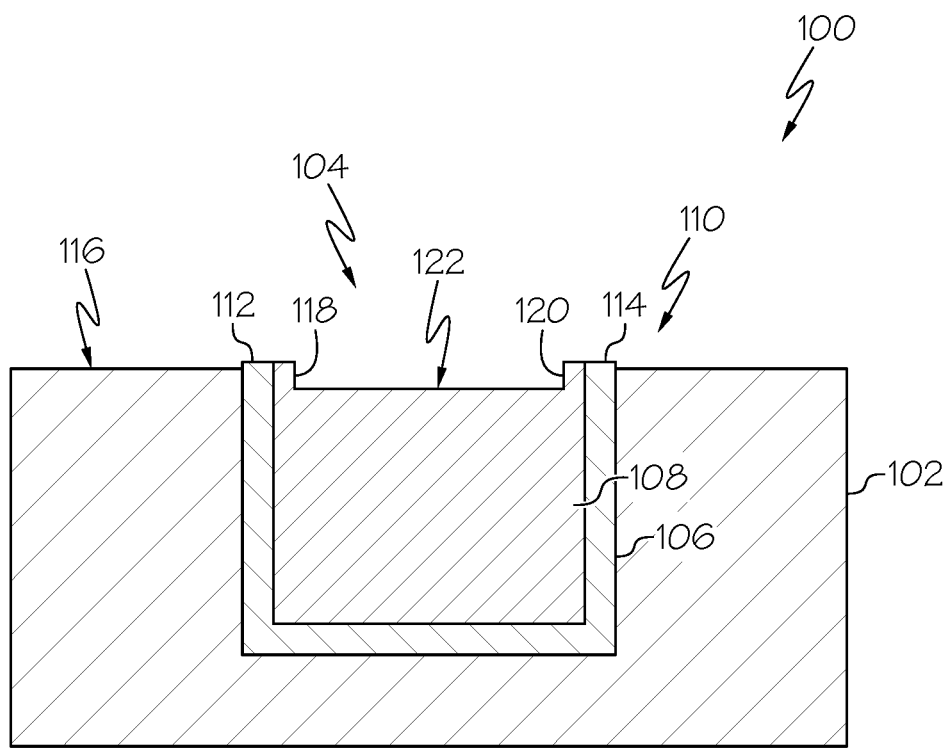
FIG. 1 is a cross-sectional view of an initial semiconductor structure comprising an Mx patterned area within a substrate according to one embodiment of the present disclosure.

Various embodiments will now be discussed in further detail with regard to semiconductor devices and methods of manufacturing same and, in particular, to a fabrication method and structure of a semiconductor device comprising a magnetoresistive random access memory (MRAM) and a self-aligned and misalignment tolerant landing pad.

It is to be understood that the various layers and/or regions shown in the accompanying drawings are not drawn to scale, and that one or more layers and/or regions of a type commonly used in complementary metal-oxide semiconductor (CMOS) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present disclosure may be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present disclosure may be used in connection with semiconductor devices that may require CMOSs, MOSFETs and/or FinFETs. By way of non-limiting example, the semiconductor devices can include, but are not limited to CMOS, MOSFET and FinFET devices, and/or semiconductor devices that use CMOS, MOSFET and/or FinFET technology.

As used herein, "vertical" refers to a direction perpendicular to a substrate in the views herein. As used herein, "horizontal" refers to a direction parallel to a substrate views herein. As used herein, "thickness" refers to a size of an element (e.g., a layer, trench, hole, etc.) in the cross-sectional views measured from a bottom surface to a top surface, or a left side surface to a right side surface of the element, and/or measured with respect to a surface on which the element is directly on.

Unless otherwise specified, as used herein, "height" or "height above a substrate" refers to a vertical size of an element (e.g., a layer, trench, hole, etc.) in the cross-sectional views measured from a top surface of the substrate to a top surface of the element. A thickness of an element can be equal to a height of the element if the element is directly on the substrate. As used herein, "lateral," "lateral side," "lateral surface" refers to a side surface of an element (e.g., a layer, opening, etc.), such as a left or right side surface in the cross-sectional views herein.

Referring to FIG. 1, a semiconductor structure 100 comprising a substrate 102 is shown. The substrate 102 may comprise silicon, but other materials are applicable as well. FIG. 1 further shows that one or more Mx patterning processes have been performed to form a trench 104 within the substrate 102. In one embodiment, the Mx patterning processes include defining the line/trench 104 using lithography. Lithography may include direct application of PR or use of more complex stacks such as trilayer (e.g., from bottom to top: OPL, SiARC/SiOx, PR). The substrate 102 is then etched using, for example, a fluorocarbon based plasma process (e.g. using $C_xF_y$ chemistry) to form the trench/line 104. The lithography is then stripped away typically using an $O_2$ plasma and then the liner is deposited.

A liner 106 may then be subsequently formed on horizontal and vertical surfaces of the trench 104. The liner 106 facilitates growth of a trench metal layer 108 (e.g., a trench line or wire). In one embodiment, the trench metal layer 108 comprises copper, but other metals or alloys are applicable as well. In some embodiments, the liner 106 comprises TaN, Ta, Co, Ru, etc. In one embodiment, the liner 106 is formed such that a lip 110 is created where portions 112, 114 of the liner 106 extend above a top surface 116 of the substrate 102. These portions 112, 114 of the liner 106 have a height that is greater than a height of the top surface 116 of the substrate 102. In some embodiments, portions 118, 120 of the trench metal layer 108 contact the inner sidewalls of the liner portions 112, 114 such that these portions 118, 120 of the trench metal layer 108 also extend beyond the top surface 116 of the substrate 102. The portions 118, 120 of the trench metal layer 108 may also formed over and in contact with a top surface of liner portions 112, 114 as well. FIG. 1 also shows that the trench metal layer 108 may be recessed in an area 122 between portions 118, 120. The recessed area 122 comprises a top surface that is below the top surface of portions 118, 120 and, in some embodiments, may be below the top surface 116 of the substrate 102.

Figure 2:
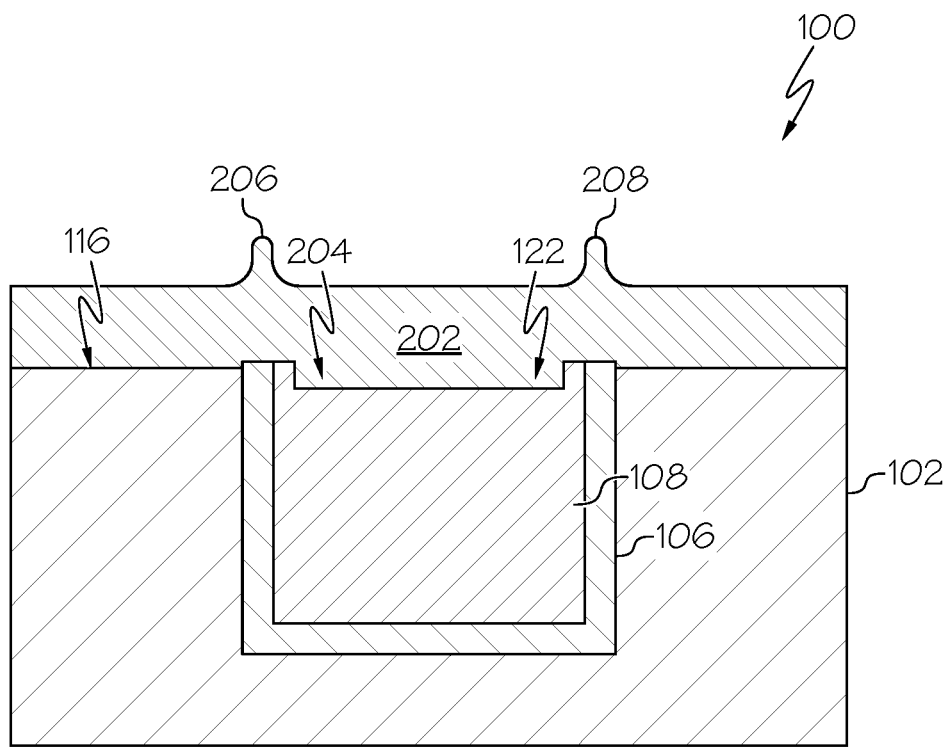
FIG. 2 is a cross-sectional view of the semiconductor structure after a landing pad layer has been formed according to one embodiment of the present disclosure.

After the structure in FIG. 1 is formed, a landing pad layer 202 comprising a conductive material such as tantalum nitride ("TaN") is then deposited over the substrate 102 and the trench metal layer 108, as shown in FIG. 2. The pad layer 202 is formed on and contacts the substrate 102 and trench metal layer 108. The pad layer 202 comprises a portion 204 that contacts the recessed area 122 of the trench metal layer 108. The pad layer 202 may be deposited using a physical vapor deposition ("PVD") method, a chemical vapor deposition method ("CVD"), or the like. In some embodiments, portion 204 of the pad layer 202 extends below the top surface 116 of the substrate 102. It should be noted that the various embodiments of the present invention are not limited to TaN for layer 202. For example, tantalum and other alloys compatible with the trench metal layer 108 may be used as well.

Figure 3:
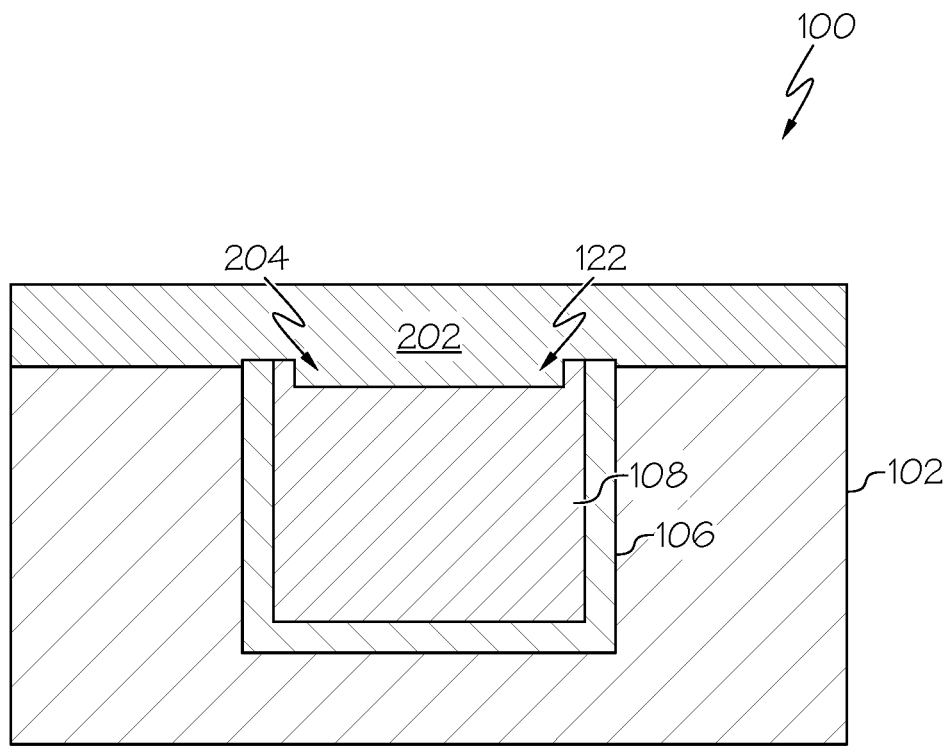
FIG. 3 is a cross-sectional view of the semiconductor structure after the landing pad layer has been planarized according to one embodiment of the present disclosure.

The lip 110 created by the liner 106 and corresponding portions 118, 120 of the trench metal layer 108 create an unwanted topography for the pad layer 202. For example, FIG. 2 shows bumps 206, 208 within the pad layer 202 resulting from the lip 110 and corresponding portions 118, 120 of the trench metal layer 108. Therefore, in one embodiment, a chemical mechanical etching process is performed to remove the bumps 206, 208 and planarize the pad layer 202, as shown in FIG. 3.

Figure 4:
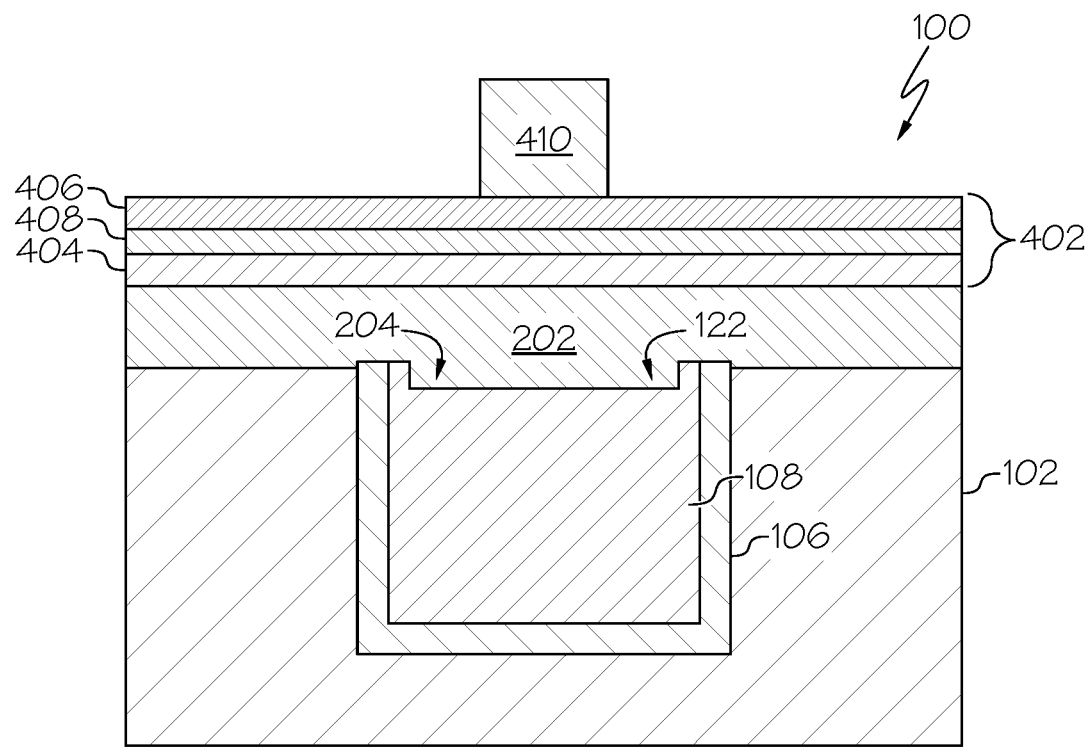
FIG. 4 is a cross-sectional view of the semiconductor structure after magnetic tunnel junction stack layers have been deposited and a hardmask has been formed according to one embodiment of the present disclosure.

After the pad layer 202 has been planarized, a magnetic tunnel junction (MTJ) stack 402 is formed on and in contact with the pad layer 202, as shown in FIG. 4. The MTJ stack 402 comprises two magnetic layers 404, 406 that are separated by an insulating layer 408 referred to as a tunnel barrier. The first magnetic layer is formed on and in contact with the pad layer 202. The insulating layer 408 is then deposited over the first magnetic layer 404, and the second magnetic layer 406 is then deposited over the insulating layer 406.

One of the magnetic layers 404, 406 has a high level of magnetization and is fixed/pinned. The other magnetic layer 404, 406 has a lower amount of magnetization and is referred to as the free layer (i.e., not pinned). The free layer is able to rotate its magnetization to be parallel with the pinned layer or anti-parallel to the pinned layer. Parallel magnetizations allow current to tunnel through the tunnel barrier resulting in low resistance. Anti-parallel magnetizations do not allow current to tunnel through the tunnel barrier resulting in high resistance. The magnetizations can be controlled either by passing current through a different copper line so that the current induces a magnetic field that interacts with the free layer or by directly injecting spin polarized current into the device which produces a torque on the magnetic free layer.

Figure 5:
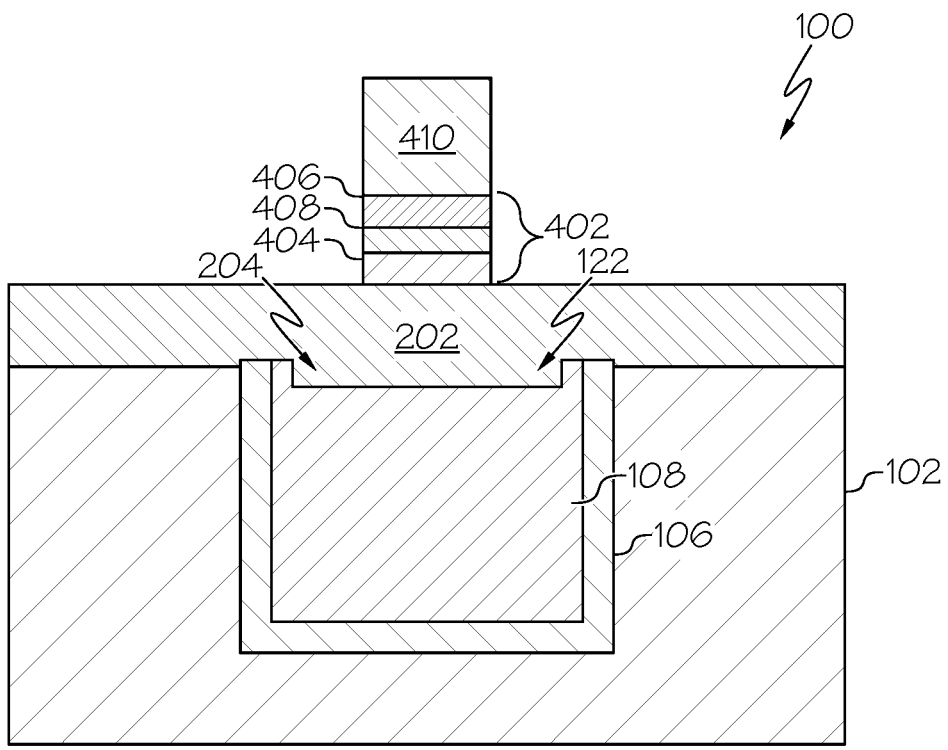
FIG. 5 is a cross-sectional view of the semiconductor structure after a magnetic tunnel junction stack formed according to one embodiment of the present disclosure.

FIG. 4 also shows a hardmask layer 410 having been formed/patterned on and in contact with the second magnetic layer 406. In one embodiment, the hardmask layer 410 comprises silicon nitride, but other materials are applicable as well. After the hardmask layer 410 is formed, the MTJ stack 402 is etched back using one or more etching processes such as reactive ion etching ("RIE"). For example, FIG. 5 shows that portions of the MTJ stack 402 not situated under the hardmask layer 408 have been removed. The etch process stops on the pad layer 202.

Figure 6:
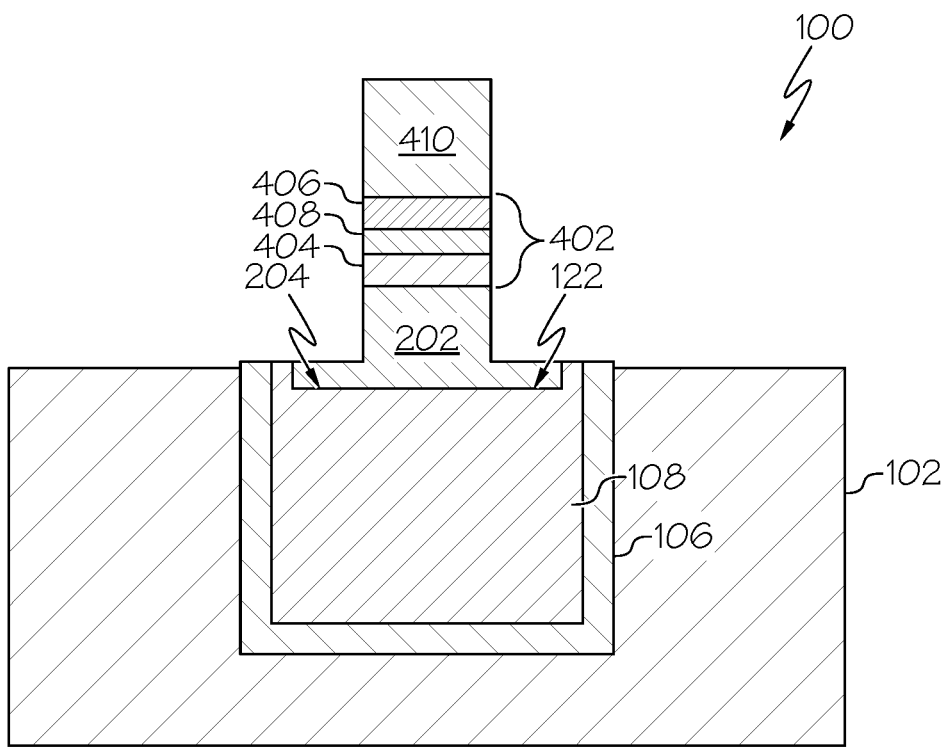
FIG. 6 is a cross-sectional view of an alternative semiconductor structure after the landing payer layer has been etched according to one embodiment of the present disclosure.

In one embodiment, the MTJ stack etching process(es) is continued to punch through the pad layer 202 as shown in FIG. 6. In some embodiments, the etch proceeds until layer 102 is exposed, i.e. the interface between layer 202 and 102 is cleared. One mechanism for achieving this is through endpoint monitoring of relevant wavelengths, e.g. a drop in the CN wavelength indicating removal of the TaN layer, or a rise in CO indicating contact w/the layer 102. In some embodiments, the etch may remove the lip areas 112, 114, 118, 120 exposed above the top surface of the substrate. However, the recessed portion 204 of the pad layer remains.

Figure 7:
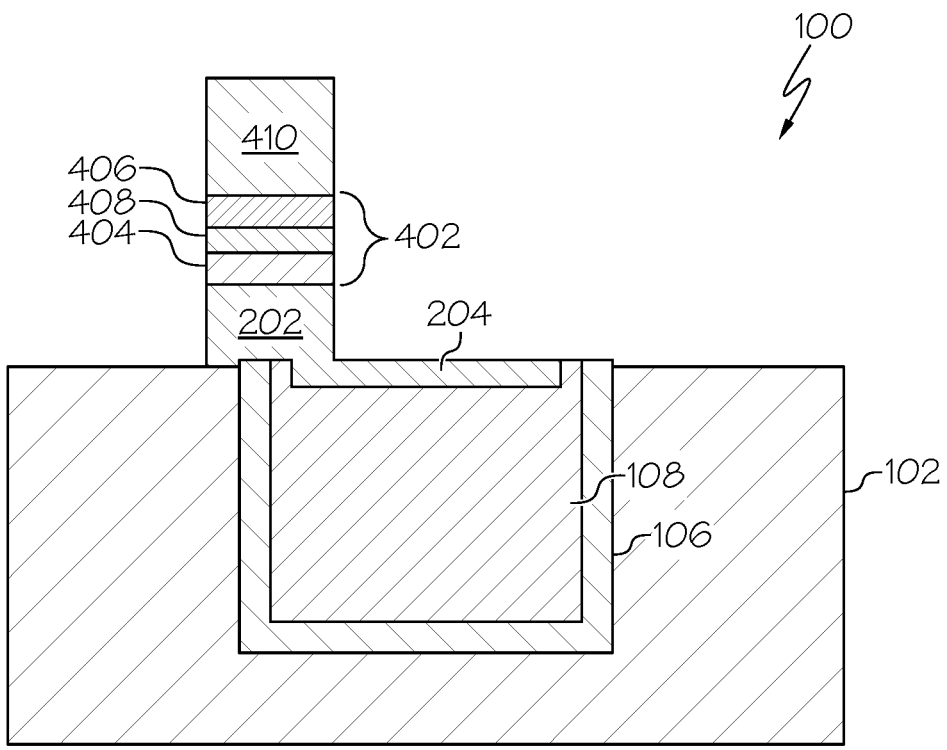
FIG. 7 is a cross-sectional view of the semiconductor structure showing a misaligned magnetic tunnel junction stack according to one embodiment of the present disclosure.

As shown in FIG. 6, the etch stops on the top surface of the substrate 102 and removes portions of the pad layer 202 that are not under the hardmask 410 and that are above the top surface of the substrate 102. The portion of the pad layer 204 within the recessed area 122 of the trench metal layer 108 remains. The punch through process electrically isolates the device laterally while preserving contact to the landing pad below. With this structure, there may be misalignment between the patterned MRAM device and the landing pad without harming the device, as shown in FIG. 7.

Figure 8:
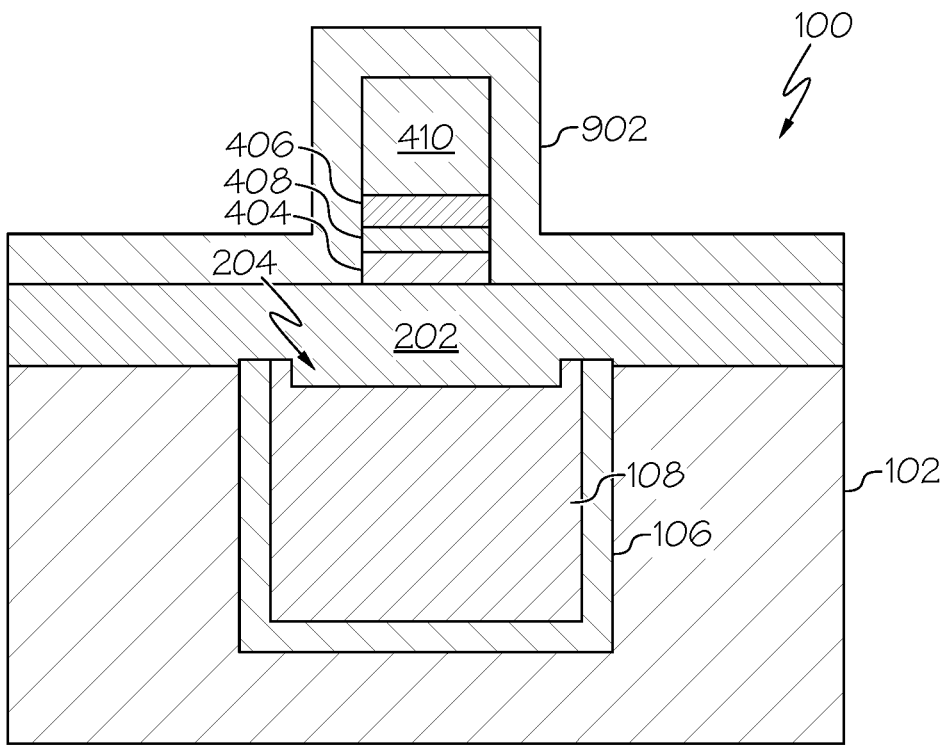
FIG. 8 is a cross-sectional view of the semiconductor structure of FIG. 5 after spacer material has been deposited over the structure according to one embodiment of the present disclosure.
Figure 9:
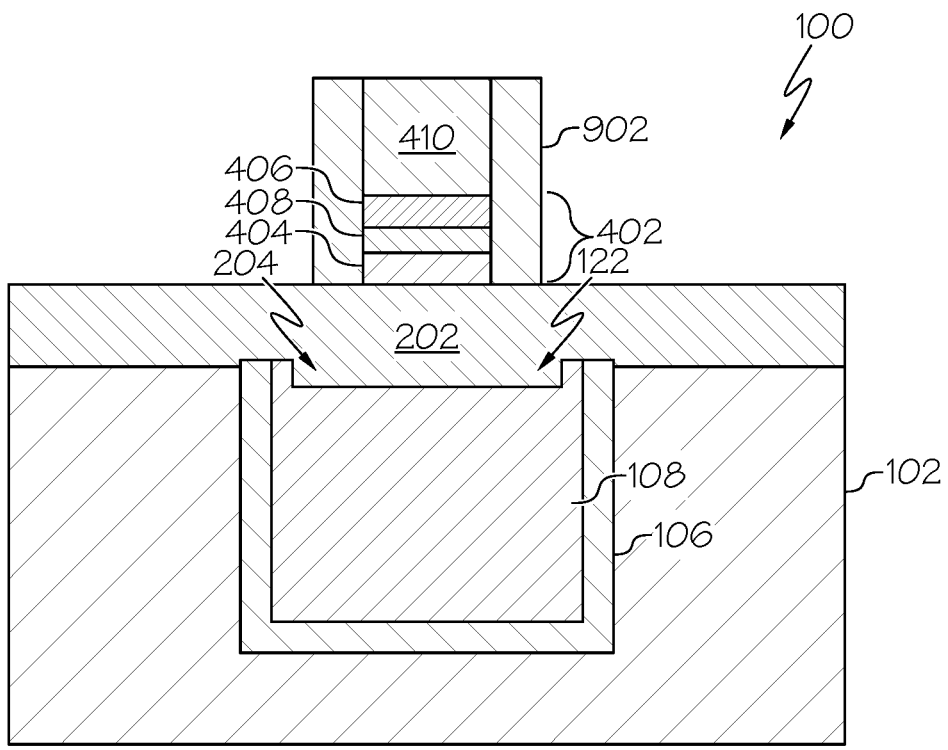
FIG. 9 is a cross-sectional view of the semiconductor structure after the spacer material has been etched to form a sidewall spacer for the magnetic tunnel junction stack according to one embodiment of the present disclosure.

FIG. 8 shows that after the MTJ stack 402 has been etched, a spacer material 802 such as silicon nitride is deposited on and in contact with the pad layer 202, the sidewalls of the MTJ stack 402, the sidewalls of the hardmask 410, and a top surface of the hardmask 410. One or more etching processes are performed to remove the spacer material 802 from horizontal surfaces of the structure. This process forms a spacer 902 on top of the pad layer 202 and the sidewalls of the MTJ stack 402 and hardmask 410, as shown in FIG. 9. The spacer 902 protects the MRAM device while opening up the pad layer 202 outside of the MRAM device area. The spacer 902 protects the MTJ stack 402 during the etching of the landing pad and also facilitates the use of more selective chemistries that can quickly etch through the landing pad. It should be noted that in some embodiments a spacer is not required to be formed over the structure shown in FIG. 6 where the punch-through occurred.

Figure 10:
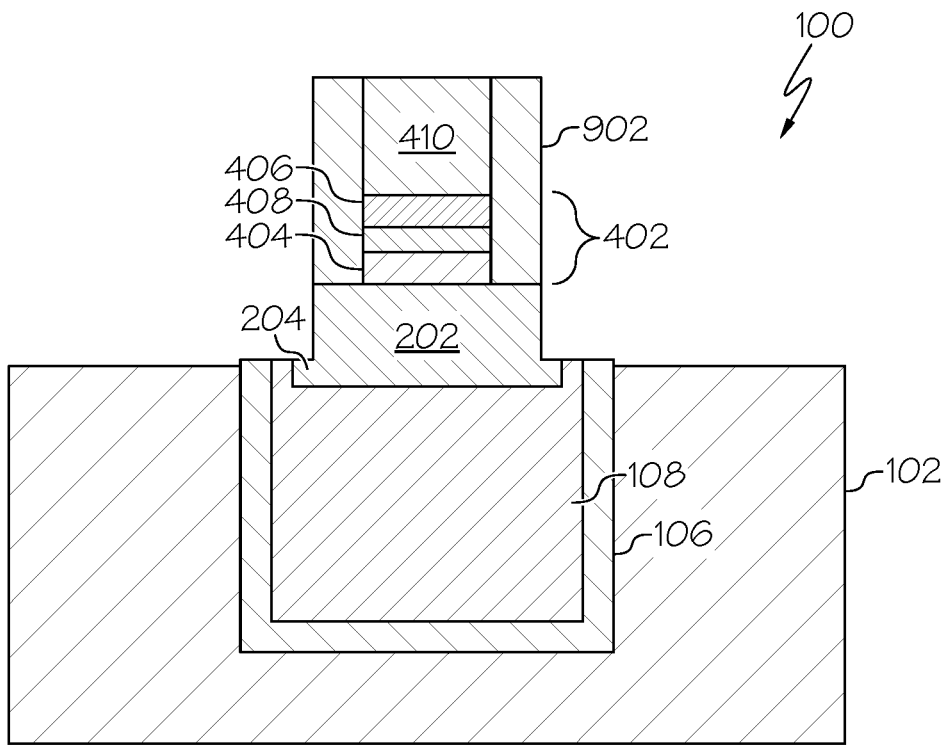
FIG. 10 is a cross-sectional view of the semiconductor structure after an operational process has been performed to remove exposed portions of the landing pad layer that are above a top surface of the substrate according to one embodiment of the present disclosure.

In an optional embodiment, one or more etching processes are performed to selectively remove any exposed portion of the pad layer 202 above the top surface of the substrate 102, as shown in FIG. 10. In this embodiment, the sidewall spacer 902 acts as an etch mask such that any portion of the pad layer 202 not underlying the spacer 902 is removed. This process exposes the top surface of the substrate 102 and the liner 106. In some embodiments, any remaining portions of the lip areas 112, 114, 118, 120 may be etched as well. Removal of the exposed portions of the pad layer 202, electrically isolates the MRAM device laterally while preserving contact to the landing pad below.

By utilizing the MTJ itself to define the landing pad, this various embodiments discussed above reduce the number of mask levels necessary to establish electrical contact between the MTJ and the underlying metal wiring layer Mx. This eliminates potential misalignment errors if a separate mask is used, which becomes increasingly probable as critical dimensions shrink. Additionally, the various embodiments provide an extra level of protection as electrical contact can still be made even if misalignment occurs in the definition of the MTJ pillar stack, whereas if the landing pad was patterned separately and misaligned, no electrical contact would be possible.

Figure 11:
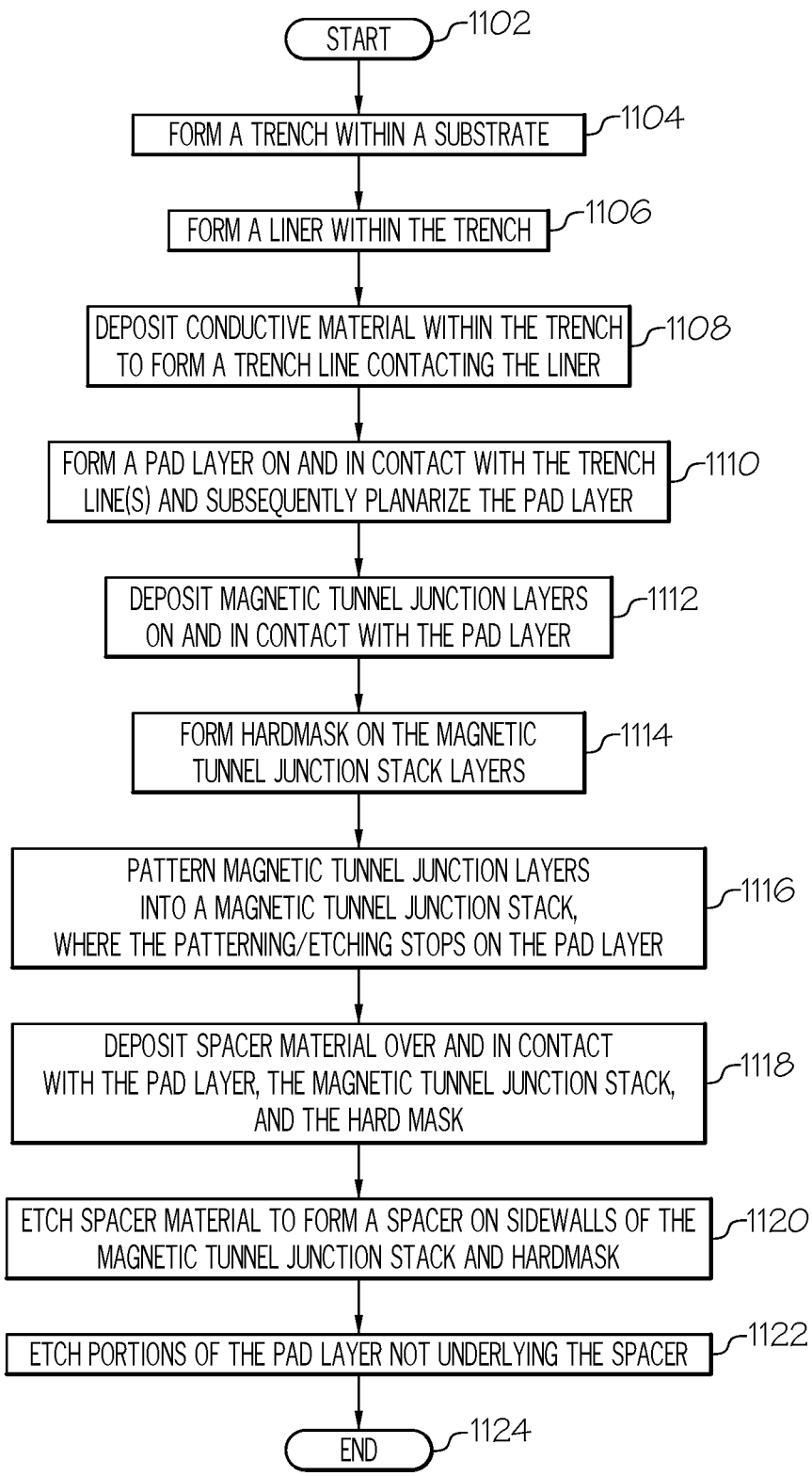
FIG. 11 is an operational flow diagram illustrating one process for forming a semiconductor structure comprising a self-aligned landing pad and a magnetic tunnel junction stack according to one embodiment of the present disclosure.

FIG. 11 is an operational flow diagram illustrating one process for forming a semiconductor structure comprising a self-aligned landing pad and a magnetic tunnel junction stack according to one embodiment of the present disclosure. In FIG. 11, the operational flow diagram begins at step 1102 and flows directly to step 1104. It should be noted that each of the steps shown in FIG. 11 has been discussed in greater detail above with respect to FIGS. 1-9.

A trench, at step 1104, is formed within a substrate. A liner, at step 1106, is then formed within the trench. A conductive material, at step 1108, is deposited within the trench to form a trench line contacting the liner. A pad layer, at step 1110, is formed on and in contact with the trench line(s) and subsequently planarized. Magnetic tunnel junction stack layers, at step 1112, are deposited on and in contact with the pad layer. A hardmask, at step 1114, is formed on the magnetic tunnel junction stack layers. The magnetic tunnel junction stack layers, at step 1116, are then patterned into a magnetic tunnel junction stack, where the patterning/etching stops on the pad layer. A spacer material, at step 1118, is deposited over and in contact with the pad layer, the magnetic tunnel junction stack, and the hardmask. The spacer material, at step 1120, is etched to form a spacer on sidewalls of the magnetic tunnel junction stack and hardmask. Portions of the pad layer not underlying the spacer are then etched, at step 1122. The control flow exits at step 1124.

Although specific embodiments of the disclosure have been disclosed, those having ordinary skill in the art will understand that changes can be made to the specific embodiments without departing from the spirit and scope of the disclosure. The scope of the disclosure is not to be restricted, therefore, to the specific embodiments, and it is intended that the appended claims cover any and all such applications, modifications, and embodiments within the scope of the present disclosure.

It should be noted that some features of the present disclosure may be used in one embodiment thereof without use of other features of the present disclosure. As such, the foregoing description should be considered as merely illustrative of the principles, teachings, examples, and exemplary embodiments of the present disclosure, and not a limitation thereof.

Also, these embodiments are only examples of the many advantageous uses of the innovative teachings herein. In general, statements made in the specification of the present application do not necessarily limit any of the various claimed disclosures. Moreover, some statements may apply to some inventive features but not to others.

What is claimed is:

1. A method for fabricating a semiconductor device, the method comprising:
    forming a pad layer in contact with a top surface and a recessed portion of at least one trench line formed within a substrate;
    depositing magnetic tunnel junction stack layers on and in contact with the pad layer; and
    etching the magnetic tunnel junction stack layers to form a magnetic tunnel junction stack, where the etching stops on the pad layer.

2. The method of claim 1, further comprising:
    prior to forming the pad layer, forming a trench within a substrate;
    forming a liner within the trench; and
    forming the at least one trench line within the trench and in contact with the liner.

3. The method of claim 1, further comprising:
    prior to depositing the magnetic tunnel junction stack layers, planarizing the pad layer.

4. The method of claim 1, wherein etching the magnetic tunnel junction stack layers to form a magnetic tunnel junction stack comprises:

forming a hardmask on the magnetic tunnel junction stack layers; and etching portions of the magnetic tunnel junction stack layers not underlying the hardmask.

5. The method of claim 4, further comprising:

etching portions of the pad layer not underlying the hardmask and above the substrate.

6. The method of claim 5, wherein etching portions of the pad layer exposes at least a top surface of the substrate and a surface of the pad layer within a recessed area of the at least one trench line.

7. The method of claim 1, further comprising:

depositing a spacer material over and in contact with the pad layer, the magnetic tunnel junction stack, and the hardmask.

8. The method of claim 7, further comprising:

etching the spacer material to form a spacer on sidewalls of the magnetic tunnel junction stack, and the hardmask.

9. The method of claim 8, further comprising:

etching portions of the pad layer not underlying the spacer.

* * * * *